United States Patent
Amagai et al.

(10) Patent No.: US 6,762,506 B2
(45) Date of Patent: Jul. 13, 2004

(54) ASSEMBLY OF SEMICONDUCTOR DEVICE AND WIRING SUBSTRATE

(75) Inventors: Masazumi Amagai, Olta (JP); Masako Watanabe, Olta (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/337,930

(22) Filed: Jan. 7, 2003

(65) Prior Publication Data

US 2003/0173587 A1 Sep. 18, 2003

(30) Foreign Application Priority Data

Jan. 7, 2002 (JP) ........................................ 2002-000283

(51) Int. Cl.[7] .............................................. H01L 23/48
(52) U.S. Cl. ...................... 257/786; 257/692; 257/693; 257/697; 257/737; 257/738; 257/780
(58) Field of Search ................ 257/E23.069, 669–676, 257/735–739, 688, 689, 692–697, 728, 752, 758, 773–776, 780–786

(56) References Cited

U.S. PATENT DOCUMENTS

| | | | | |
|---|---|---|---|---|
| 4,756,467 A | * | 7/1988 | Schatzberg | ................ 228/208 |
| 5,148,266 A | * | 9/1992 | Khandros et al. | ............ 257/773 |
| 5,719,070 A | * | 2/1998 | Cook et al. | ................... 438/614 |
| 5,937,320 A | * | 8/1999 | Andricacos et al. | ........ 438/614 |
| 6,013,572 A | * | 1/2000 | Hur et al. | .................... 438/614 |
| 6,310,403 B1 | * | 10/2001 | Zhang et al. | ............... 257/786 |
| 6,486,411 B2 | * | 11/2002 | Miura et al. | ................. 174/256 |
| 2002/0149113 A1 | * | 10/2002 | Ray et al. | .................... 257/772 |
| 2003/0030133 A1 | * | 2/2003 | Terui et al. | .................. 257/678 |

* cited by examiner

Primary Examiner—David Nelms
Assistant Examiner—Andy Huynh
(74) Attorney, Agent, or Firm—W. Daniel Swayze, Jr.; W. James Brady; Frederick J. Telecky, Jr.

(57) ABSTRACT

Apparatus and method for assembling a semiconductor device on a wiring substrate is disclosed, wherein Pb (lead) is not used and the chance of generation of defects is reduced. Semiconductor package (100) has solder balls (114) containing Sn (tin), Ag (silver) and Cu (copper). Wiring substrate 200 has connecting terminals 208 for connecting solder balls (114). The connecting terminals (208) have an Au (gold) layer (212) and a Ni layer (210). In the operation for assembling semiconductor package (100) onto wiring substrate (200), because solder balls (114) are heated and fixed on connecting terminals (208), Au in Au layer (212) diffuses into balls (114). Because Au is contained in solder balls (114), a high bonding strength is obtained, and the chance of generation of defects is reduced.

8 Claims, 6 Drawing Sheets

ASSEMBLY OF SEMICONDUCTOR DEVICE AND WIRING SUBSTRATE

FIELD OF THE INVENTION

This invention relates generally to assembly of integrated circuit semiconductor devices onto printed circuit boards or other wiring substrates; and, in particular, to methods and apparatus useful for electrically interconnecting such devices to such substrates

BACKGROUND OF THE INVENTION

In recent years, with semiconductor packages becoming smaller and having more pins, attention has turned to a BGA (ball grid array) structure that makes use of solder balls as the external connecting terminals between the semiconductor device and a printed circuit board or other wiring substrate. For the BGA-structure semiconductor package, solder balls are installed on the inner surface (the surface opposite the principal surface where the semiconductor chip is carried) of the insulating substrate that carries the semiconductor chip. Usually, the solder balls are made of an alloy containing Sn (tin) and Pb (lead). When the semiconductor package is assembled on a wiring substrate, the solder balls are soldered onto the connecting terminals of the wiring substrate, so that electrical connection between the semiconductor chip and the wiring substrate is ensured. However, when the semiconductor chip is in operation and heat is generated, the solder balls are subjected to stress and may be damaged due to differences in thermal expansion between the semiconductor package and the wiring substrate. Damage to the solder balls leads to poor electrical connection between the elements. Consequently, measures should be taken to suppress generation of such defects. In addition, in recent years, from the viewpoint of environmental protection, there is a demand to stop using Pb.

An object of this invention is to provide methods and apparatus useful to reduce the use of Pb and lessen the potential for generation of such defects in the assembly of semiconductor devices onto wiring substrates

SUMMARY OF INVENTION

In one aspect of the invention, a semiconductor device is provided having an external connecting terminal dimensioned, configured and adapted for electrical connection to a corresponding external connecting terminal portion of a printed circuit board or other wiring substrate. The semiconductor device has a semiconductor chip with an electrode pad, an installing portion electrically connected to the electrode pad, and the external connecting terminal installed on the installing portion. The external connecting terminal comprises Sn (tin), Ag (silver), Cu (copper) and Au (gold).

In a second aspect of the invention, a wiring substrate is provided having an external connecting terminal portion dimensioned, configured and adapted for electrical connection to a corresponding external connecting terminal of a semiconductor device. The wiring substrate has an insulating substrate and a connecting terminal portion formed on the insulating substrate. The external connecting terminal portion comprises Sn, Ag, Cu and Ag.

In another aspect of the invention, a semiconductor device in accordance with the first aspect of the invention is mounted in electrical interconnection with a wiring substrate in accordance with the second aspect of the invention. Both the connecting terminal of the semiconductor device and the connecting portion of the wiring substrate comprise Sn, Ag, Cu and Ag.

In described embodiments, the installing portion of the semiconductor device has a layer comprising Au. The connecting terminal portion of the wiring substrate also has a layer comprising Au. The Au layers are formed on layers comprising Ni. The content of Au in the external connecting terminals is in the range of 0.1–12.0 wt %. It is preferred that the content of Ag in the external connecting terminals be in the range of 1.0–3.5 wt %. In addition, it is preferred that the content of Cu in the external connecting terminals be in the range of 0.5–1.0 wt %. In addition, it is preferred that an electroconductive paste containing Sn, Ag and Cu be used for assembling the semiconductor device onto the wiring substrate.

DETAILED DESCRIPTION OF EMBODIMENTS

Embodiments of the invention are described with reference to the figures.

Figure 1:
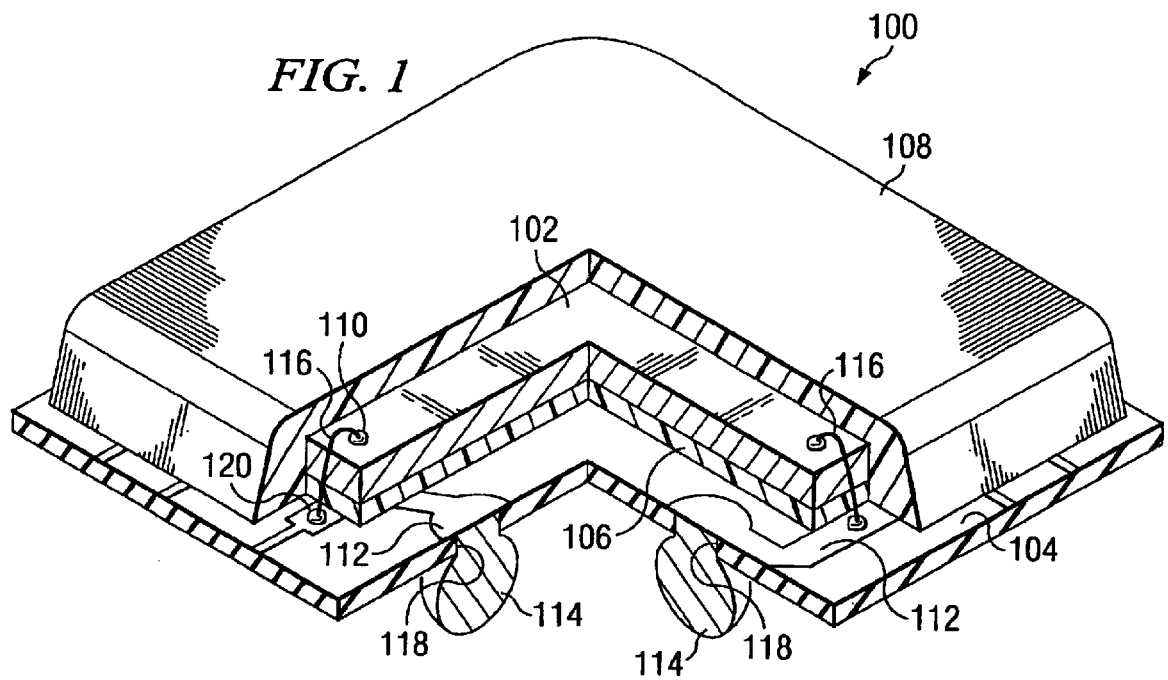
FIG. 1 is a partially cut-away perspective view illustrating the structure of a semiconductor device package in accordance with an embodiment of the invention.

FIG. 1 is a partially cut-away perspective view illustrating the overall structure of a semiconductor device in accordance with the invention. As shown for a semiconductor device package 100 in FIG. 1, a semiconductor chip 102 is fixed on a principal surface of an insulating substrate 104 by means of a die paste adhesive 106, and is sealed with an encapsulating sealant 108. Semiconductor chip 102 forms an integrated circuit (not shown) on at least one surface (viz. the upper surface shown in the figure) of a silicon substrate. On the outer periphery of the surface of semiconductor chip 102 on the side of the integrated circuit, plural electrode pads 110 leading out from said integrated circuit are set in a row.

Insulating substrate 104 is a substrate made of polyimide or ceramics. A conductor pattern 112 made of Cu is formed on the principal surface of insulating substrate 104, and electroconductive solder balls 114 are set as external connecting terminals on the inner surface of insulating substrate 104. Conductor pattern 112 is connected through conductor wires 116 to electrode pads 110 of semiconductor chip 102, and, at the same time, pattern 112 is connected via through-holes 118 on insulating substrate 104 to solder balls 114.

Solder balls 114 may have a spherical shape with diameter of about 0.25 mm, and may be made of an alloy containing Sn, Ag and Cu, with Ag content in the range of 1.0–3.5 wt % and Cu content in the range of 0.5–1.0 wt %. When semiconductor package 100 is assembled onto a wiring substrate 200 (such as illustrated in FIG. 2), the solder balls 114 are connected to connecting terminals 208 on surface of the wiring substrate.

Figure 2:
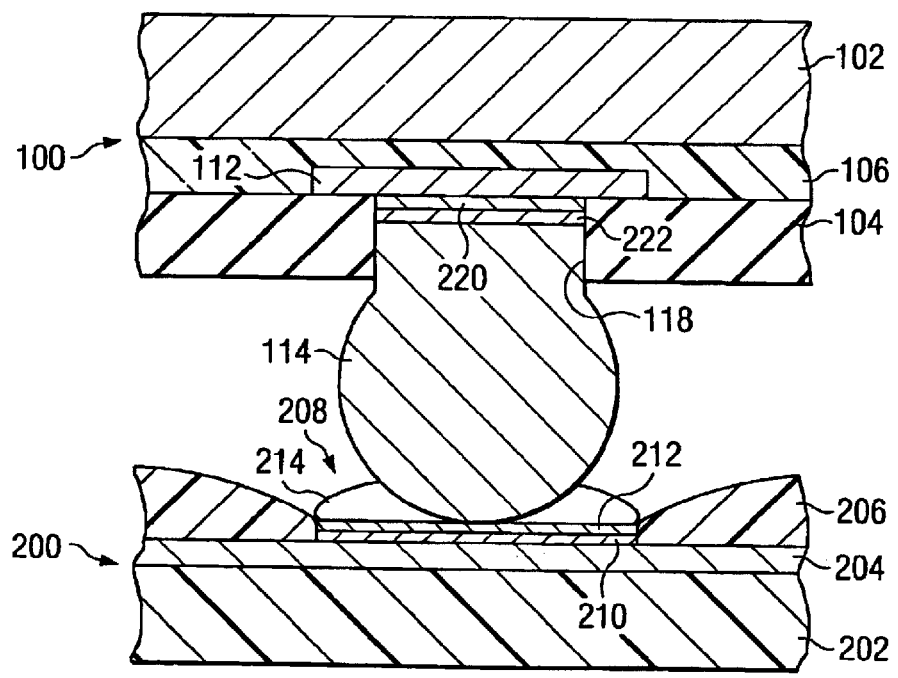
FIG. 2 is a cross-sectional view illustrating the state of assembly of the semiconductor package of FIG. 1 onto corresponding parts of a wiring substrate.

FIG. 2 is an enlarged cross-sectional view illustrating the assembly of a semiconductor package 100 on a wiring substrate 200. Wiring substrate 200 may be prepared by forming an electroconductive layer 204 made of Cu on the surface of insulating substrate 202 made of resin, followed by coating the surface of the electroconductive layer 204 with an insulating layer 206. Insulating layer 206 is formed such that only the portion of electroconductive layer 204 to become connecting terminals 208 is exposed. Insulating substrate 202 may have a thickness in the range of 0.4–3.0 mm, electroconductive layer 204 may have a thickness in the range of 10–50 μm; and insulating layer 206 may have a thickness in the range of 3–50 μm.

The illustrated connecting terminals 208 include a Ni layer 210 formed by plating Ni onto the surface of electroconductive layer 204, and a Au layer 212 is formed by plating Au onto the same surface over the Ni layer 210. The thickness of Ni layer 210 may be in the range of 1–10 μm. The Au layer 212 is formed with an appropriate thickness such that, for example, the content of Au in solder balls 114 will be in the range of 0.1–12 wt % when Au atoms diffuse into the solder balls 114 as described later.

Solder balls 114 are fixed via electroconductive solder paste 214 onto the surface of Au layer 212 of connecting terminals 208. It is preferred that solder paste 214 have the same composition as that of solder balls 114. However, it may also have other compositions (for example, an alloy containing Sn and Pb).

Through-holes 118 are formed through insulating substrate 104 of semiconductor device 100. In through-holes 118, a Ni layer 220 is formed on the lower surface (as shown in the figure) of conductor pattern 112, and a Au layer 222 is formed on the same conductor pattern surface over the lower surface (as shown in the figure) of Ni layer 220. Insulating substrate 104 may have a thickness in the range of 75–100 μm, Ni layer 220 may have a thickness of 1–10 μm, and Au layer 222 may have a thickness in the range of 0.1–2.0 μm. The through-holes 118, Ni layer 220 and Au layer 220 form an installing portion for installing solder balls 114 via solder paste (not shown).

In the illustrated implementation, Au layers 212, 222 are formed at positions in contact with solder balls 114. This is so that when solder balls 114 are heated for connection to connecting terminals 208, Au atoms in Au layers 212, 222 diffuse into solder balls 114. Because Au atoms diffuse into solder balls 114, solder balls 114 will have a composition containing Sn, Ag, Cu and Au, so that the connecting strength becomes higher, and the fatigue lifetime becomes longer. In the given example, in addition to Sn as the principal component, solder balls 114 also contain Ag and Cu. As a result, it is possible to ensure the strength and to improve the creep resistance without using Pb.

In the following, an example of a method for assembling semiconductor package 100 onto wiring substrate 200 is.

FIG. 3 is a schematic diagram illustrating a method for manufacturing semiconductor package 100. First, as shown in FIG. 3A, through-holes 118 are formed on insulating substrate 104 by photolithography or punching. Then, as shown in FIG. 3B, on the principal surface of insulating substrate 104 having through-holes 118, conductor pattern 112 is formed by photolithography. Next, as shown in FIG. 3C, die paste 106 made of an epoxy-based resin is dripped onto a chip-carrying region of insulating substrate 104. Then, as shown in FIG. 3D, semiconductor chip 102 (manufactured in a separate step) is pressed on and attached to die paste 106. By means of a heater or the like, the temperature of the atmosphere is raised to cure die paste 106, so that semiconductor chip 102 is fixed on insulating substrate 104.

Figure 3A:
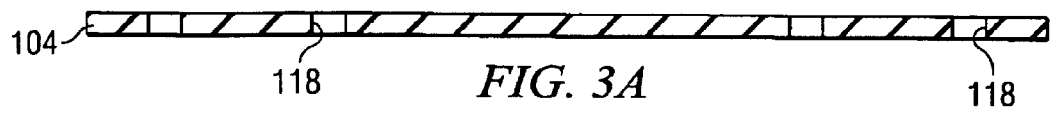
FIGS. 3A–3F present cross-sectional views illustrating steps in a process for the manufacture of the semiconductor package shown in FIG. 1.
Figure 3B:
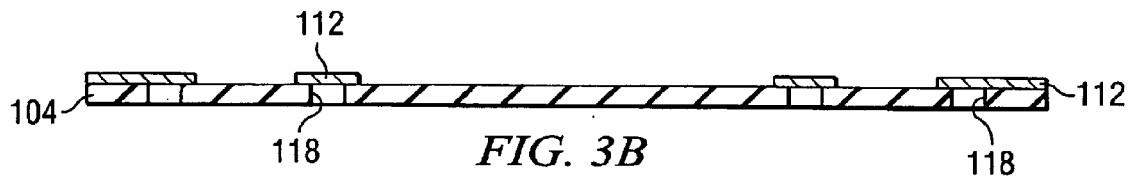
Figure 3C:
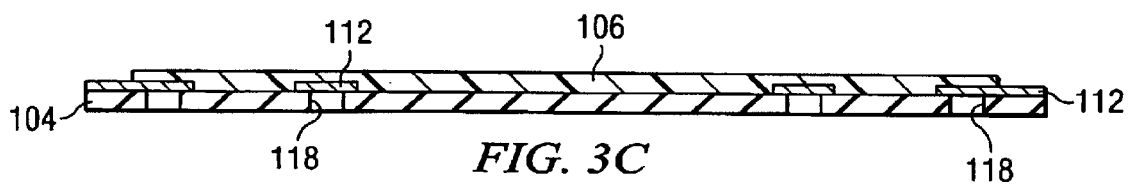
Figure 3D:
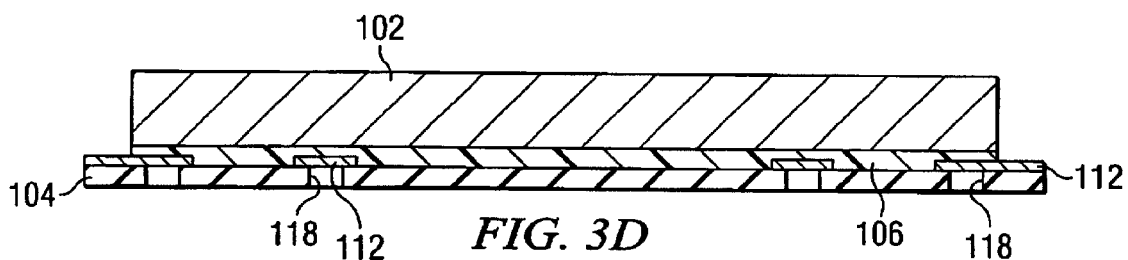
Figure 3E:
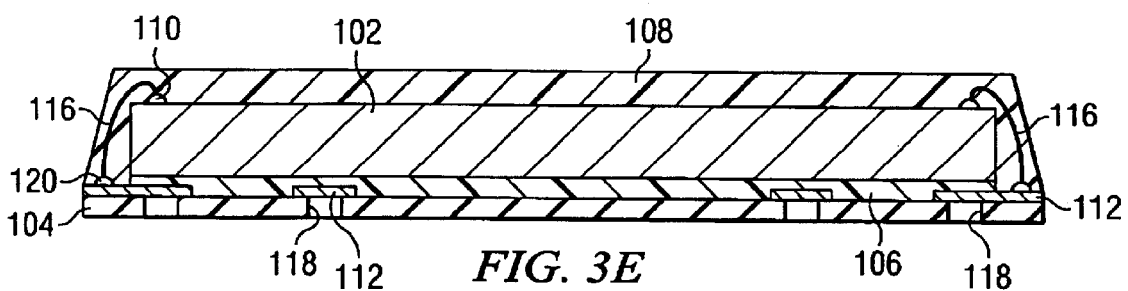
Figure 3F:
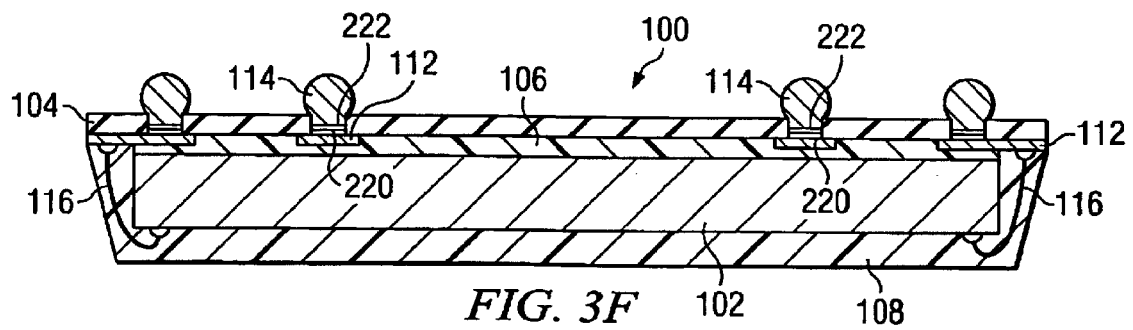

After fixing semiconductor chip 102 onto insulating substrate 104, electrode pads 110 of semiconductor chip 102 and wire connecting lands 120 are bonded to each other with conductor wires 116, as shown in FIG. 3E. After completion of bonding, semiconductor chip 102 is encapsulated with sealant 108 made of a mold resin. Then, as shown in FIG. 3F, Ni layer 220 and Au layer 222 are sequentially formed on conductor pattern 112 on insulating substrate 102 within through-holes 118. This is followed by filling the through-holes 118 with solder paste by means of squeezing or the like, and mounting solder balls 114 via said solder paste to complete the semiconductor package 100.

Figure 4A:
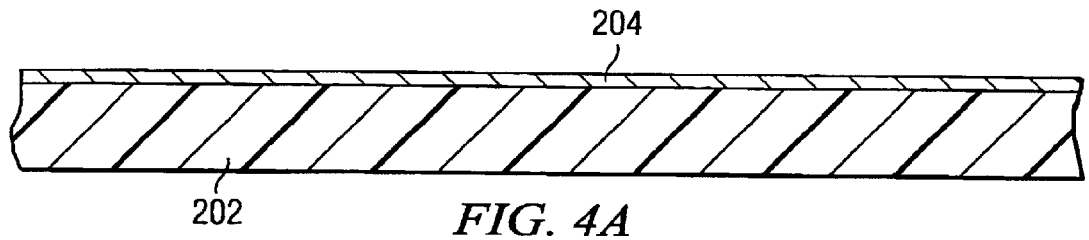
FIGS. 4A–4C present cross-sectional views illustrating steps in a process for the assembly of the semiconductor package of FIG. 1 onto a wiring substrate.
Figure 4B:
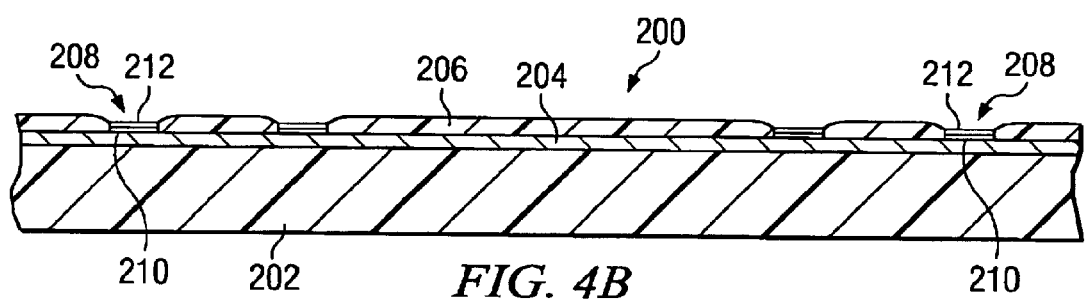

FIGS. 4A and 4B illustrate schematically a process for manufacturing relevant portions of a wiring substrate 200. First, as shown in FIG. 4A, an electroconductive layer 204 made of Cu is formed on a surface of insulating substrate 202. Then, as shown in FIG. 4B, a Ni layer 210 and Au layer 212 are sequentially formed by plating onto the same surface over electroconductive layer 204. The layers 204, 210 and 212 can be appropriately patterned, as needed. An insulating layer 206 is formed over the layers 204, 210 and 212, except for the portions corresponding to connecting terminals 208.

Figure 4C:
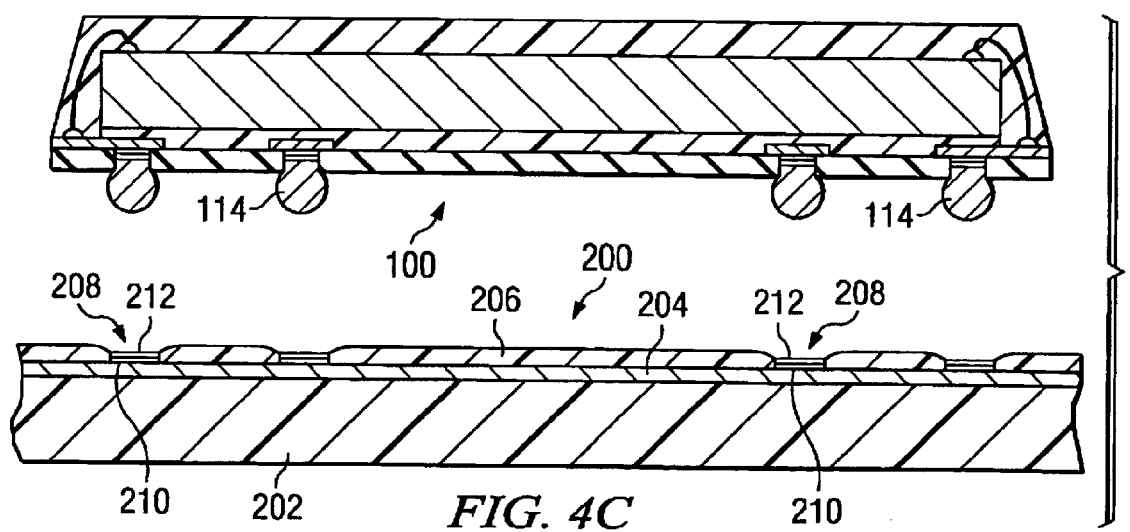

FIG. 4C illustrates an assembly of semiconductor device 100 onto wiring substrate 200. Paste (not shown) is pre-coated onto the surface of Au layer 212 of connecting terminals 208 on wiring substrate 200, which is brought into contact with solder balls 114 of semiconductor device 100, followed by heat treatment at about 220–250° C. As a result, solder balls 114 of semiconductor device 100 are connected to connecting terminals 208 of wiring substrate 200 and semiconductor device 100 is assembled onto wiring substrate 200, forming the assembled wiring substrate (wiring substrate with semiconductor assembled on it). When solder balls 114 are fixed on connecting terminals 208, Au atoms of Au layers 212, 222 diffuse into solder balls 114. Consequently, in addition to Sn, Ag, and Cu, solder balls 114 now also contain Au, so that a high connecting strength and a long fatigue lifetime are realized.

As explained above, in this embodiment, solder balls 114 with a composition containing Sn, Ag, Cu are used, and Au diffuses into solder balls 114 when semiconductor package 100 is assembled in wiring substrate 200. As a result, the connection strength is increased and the fatigue lifetime is prolonged. Consequently, there is no need to make use of Pb, and it is possible to reduce the chance of defects and the accompanying damage to solder balls 114.

In particular, by having the content of Au in solder balls 114 in the range of 0.1–12 wt %, it is possible to obtain a high tensile strength and shear strength of solder balls 114.

In addition, in the composition of solder balls 114, by having a content of Ag in the range of 1–3.5 wt % and a content of Cu in the range of 0.5–1.0 wt %, it is possible to increase the creep resistance.

Au may be contained in solder balls 114 from the beginning instead of forming Au layers 212, 222 on connecting terminals 208 of wiring substrate 200. In this case, solder balls 114 are made of an alloy containing Sn, Ag, Cu and Au. The content of Au is in the range of 0.1–12 wt %. Just as in the aforementioned embodiment, the content of Ag is in the range of 1.0–3.5 wt %, and the content of Cu is in the range of 0.5–1.0 wt %. Even in this case, since Au is contained in solder balls 114, it is possible to improve the bonding strength and fatigue lifetime, and to reduce the chance of generation of defects due to damage to solder balls 114.

Figure 5A:
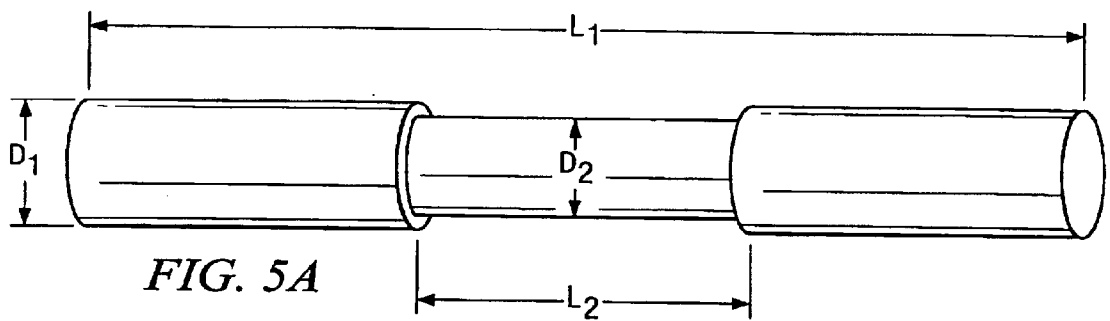
FIGS. 5A–5C are diagrams illustrating the testing and viscoelasticity of solder material in described embodiments.
Figure 5B:
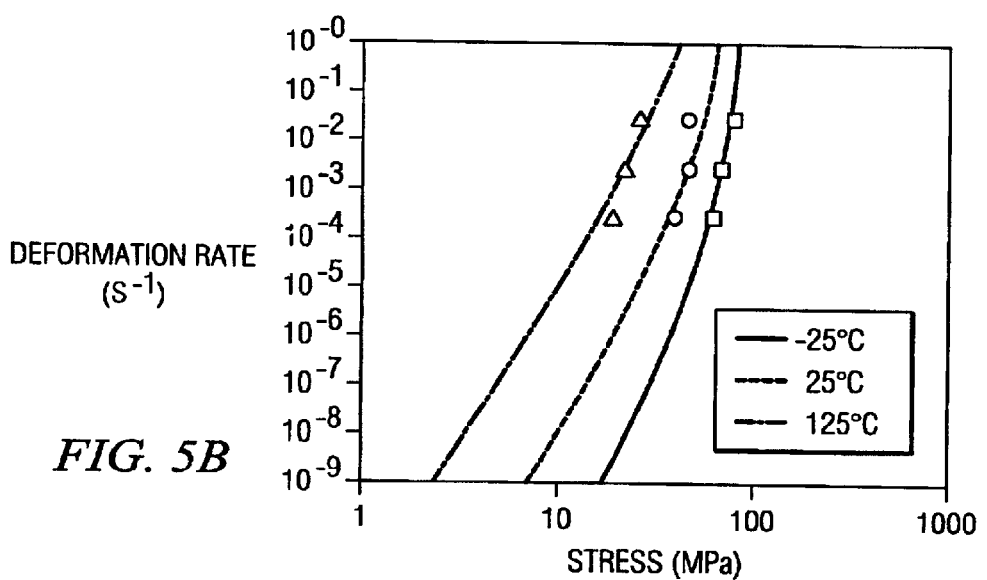
Figure 5C:
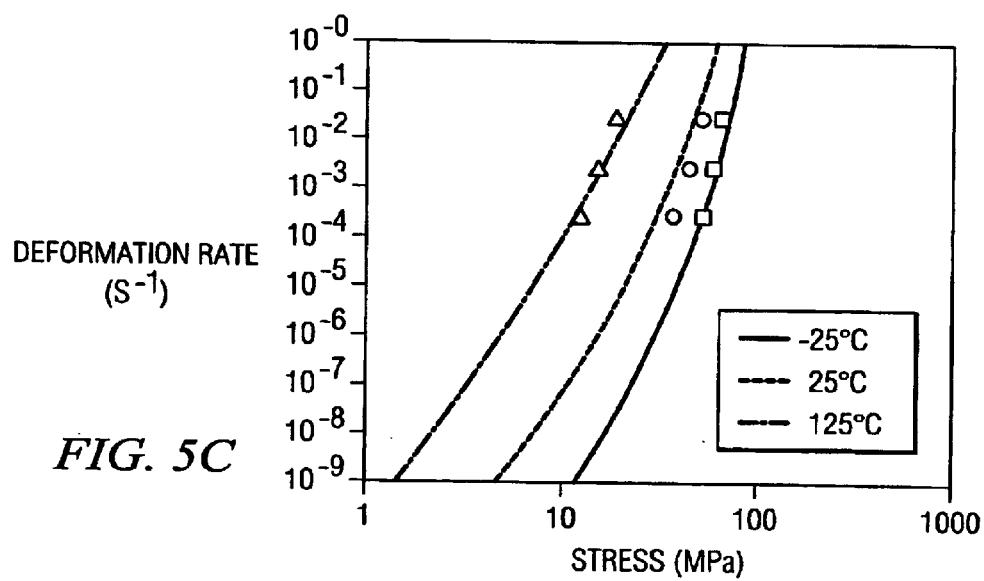
Figure 6:
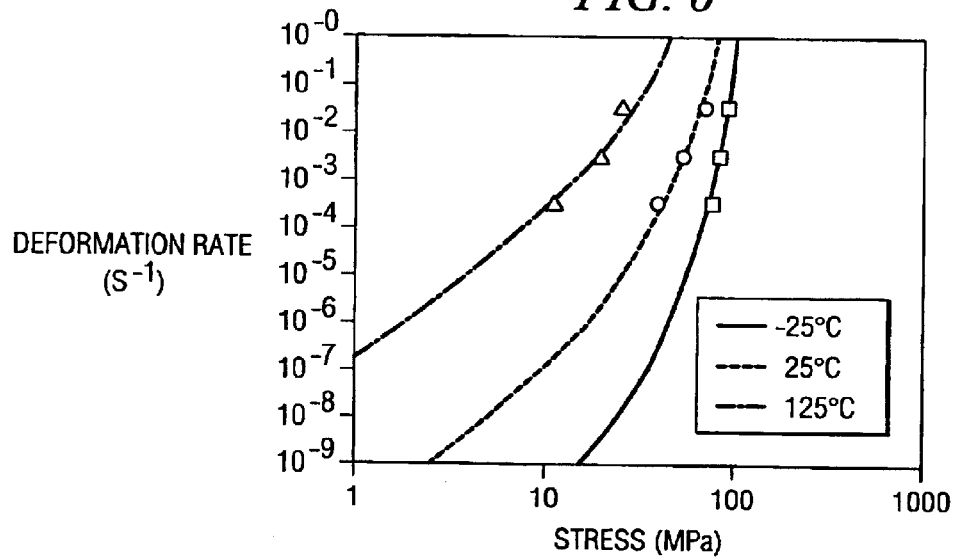
FIG. 6 is a diagram illustrating the viscoelasticity of a conventional solder material.

In the following, the effects of the above described embodiments are explained with reference to specific test examples. First, test results for the viscoelasticity of the solder material are explained. In the test, solder materials of two compositions made of Sn, Ag and Cu were used to form specimens, respectively. Composition (1) contained 3.5 wt % of Ag and 0.75 wt % Cu. Composition (2) contained 1.0 wt % of Ag and 0.5 wt % of Cu. As shown in FIG. 5A, the specimen had a cylindrical shape with length L1 of 140 mm and outer diameter D1 of 15 mm, and with the outer diameter of the central region in the longitudinal direction smaller. The portion with a smaller outer diameter had length L2 of 50 mm, and outer diameter D2 of 10 mm. For the specimens, tensile test was performed at three temperatures (−25° C., +25° C., +125° C.) to study the relationship between the deformation rate and the yield stress. The results are shown in FIGS. 5B and 5C. For comparison purposes, FIG. 6 illustrates the results obtained in the same tests performed for a conventional Pb-containing solder material (a material containing 63 wt % of Sn and 37 wt % of Pb). In FIGS. 5B, 5C and 6, the abscissa represents the deformation rate and the ordinate represents the stress.

As can be seen from FIGS. 5B, 5C and 6, compared with the conventional solder material, compositions (1) and (2) are less amenable to influence of the deformation speed under a low stress. That is, they have better creep resistance.

Figure 7A:
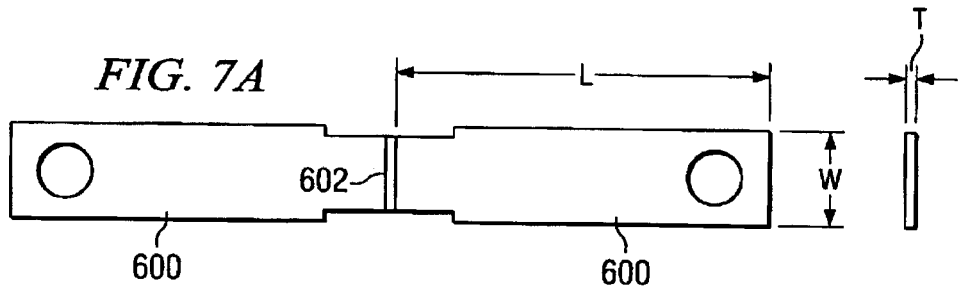
FIGS. 7A–7C are diagrams illustrating the testing and relationships between the presence/absence of a Ni layer and Au layer and the bonding strength.
Figure 7B:
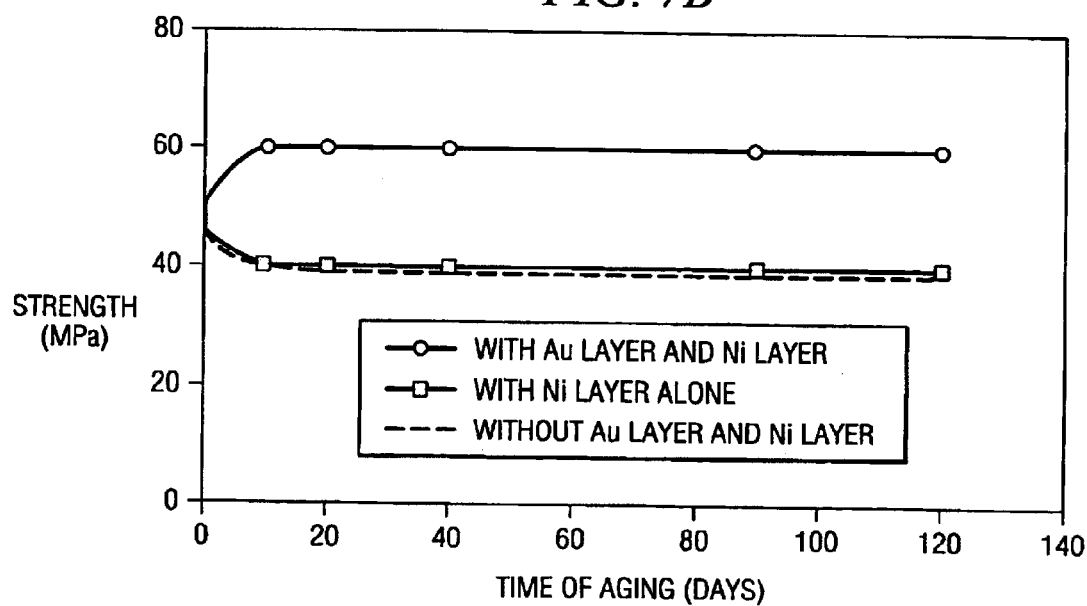
Figure 7C:
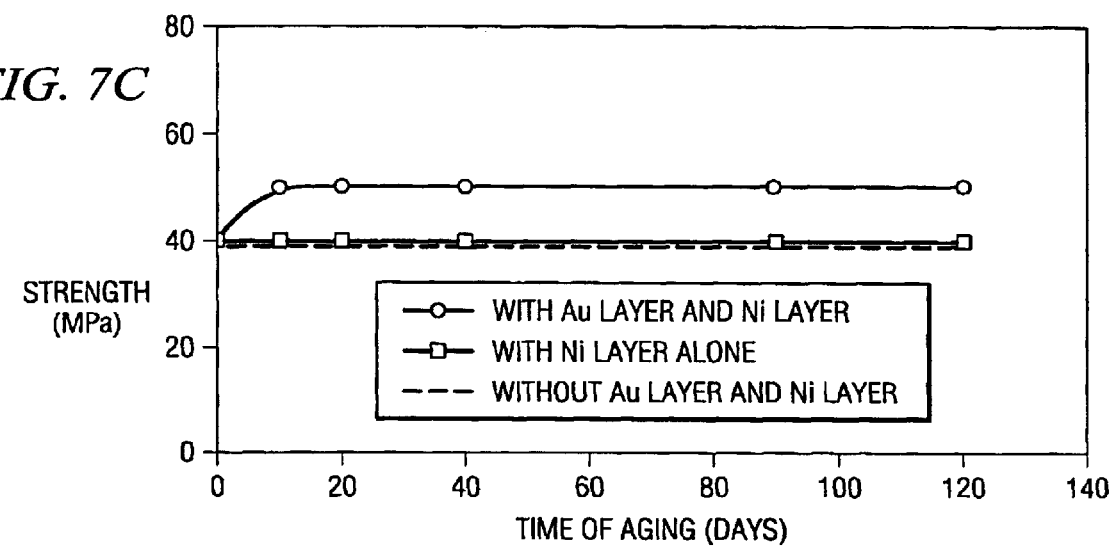

In the following, the results of tests on the bonding strength of the solder material are given. As shown in FIG. 7A, solder material 602 with composition (1) or (2) was used to bond the end surfaces of two copper plates 600. Each copper plate 600 had a length L of 59 mm, width W of 15 mm, and thickness t of 0.9 mm. In this case, a tensile test was performed for each of the following samples: a sample prepared by prior application of Ni plating (thickness of 3 μm) on the bonding end surface; a sample prepared by applying Ni plating (thickness of 3 μm) and then applying Au plating (thickness of 0.6 μm) on the Ni plating layer; and a sample prepared without applying any plating. FIG. 7B shows the results of the test performed for composition (1). FIG. 7C shows the results of the test performed for composition (2). As can be seen from FIGS. 7B and C, for both compositions (1) and (2), when Au plating is applied on Ni plating, the highest bonding strength is displayed. It is believed that this is due to diffusion of Au into the solder material during soldering.

Figure 8:
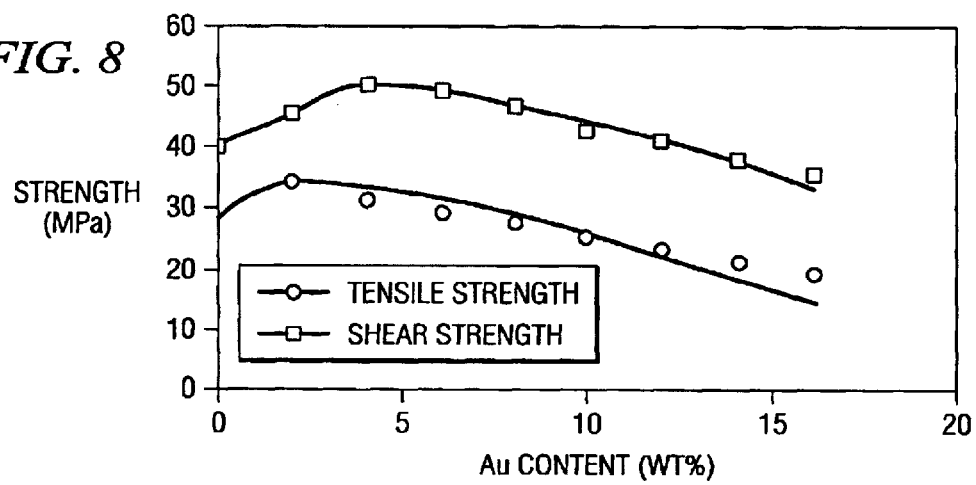
FIG. 8 is a diagram illustrating the relationship between the content of Au and the tensile strength and shear strength.

In the following, the results of tests performed on the relationship between the content of Au and the strength for the composition made of Sn, Au, Cu and Au are explained. In this case, the content of Ag was fixed at 1.0 wt %, and the content of Cu was fixed at 0.5 wt %, while the content of Au was varied in preparing the specimens. For each specimen, the tensile strength and shear strength were measured. FIG. 8 illustrates the results of the measurement. As can be seen from FIG. 8, when the content of Au is in the range of 0.1–12.0 wt %, an especially high tensile strength is obtained, and, when the content of Au is in the range of 0.1–9.0 wt %, an especially high shear strength is obtained.

In the following, the results of the temperature cycle test of assembly of the semiconductor package 100 on wiring substrate 200 are explained. This case uses, as an example, a semiconductor package 100 measuring 9 mm×6 mm which carries 103 balls (set at pitch of 0.5 mm). The size of semiconductor chip 102 is 5 mm×3 mm×0.28 mm. The diameter of solder balls 114 is 0.25 mm, and the composition (1) is adopted as its composition. The composition 2 is adopted as the composition of solder paste 214. Wiring substrate 200 has a thickness of 0.8 mm, and connecting terminals 208 have an inner diameter of 0.3 mm. In the connecting terminals 208, 3 μm-thick Ni layer 210 and 0.6 μm-thick Au layer 212 are formed. When Au diffuses into solder balls 114, the content of Au becomes 6.9 wt %.

Figure 9:
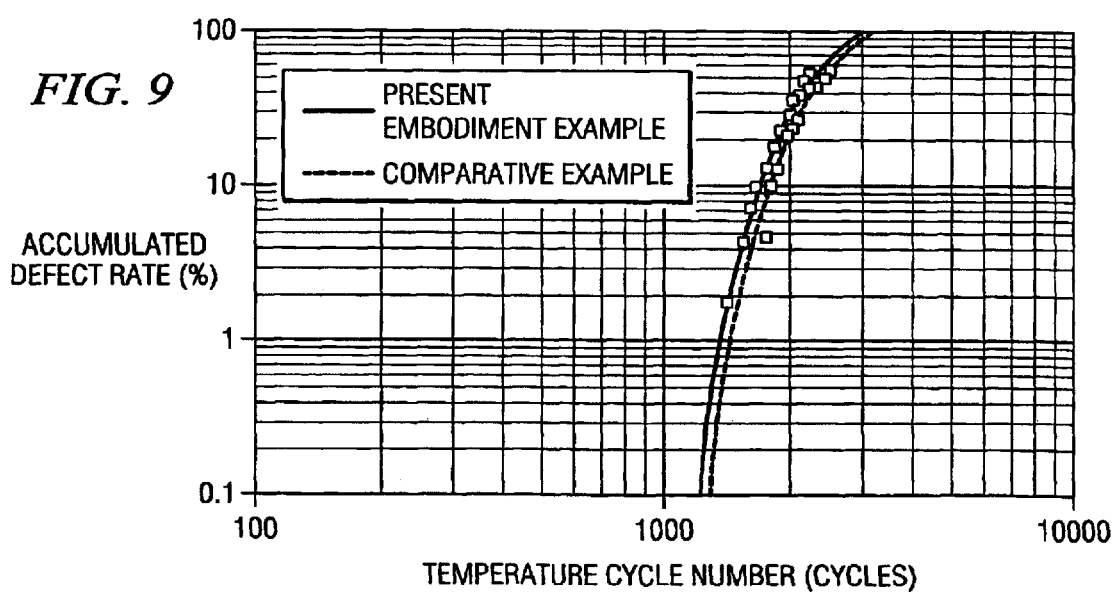
FIG. 9 is a diagram illustrating the results of temperature cycle tests performed for assembly of semiconductor package 100 on wiring substrate 200.

In the temperature cycle test, the temperature is alternately set at −40° C. and 125° C., with each setting lasting 10 min. The time in heating/cooling is 5 min. In this temperature cycle test, the occurrence of cracks in the solder bonding portion was observed. As a comparative example, the same test was performed for samples prepared by assembly without forming Au layers 212, 222 and Ni layers 210, 220. The test results are shown in FIG. 9. In FIG. 9, the abscissa represents the cycle number, and the ordinate represents the defect generation rate.

As can be seen from FIG. 9, while initial defect appears in the $900^{th}$ cycle in the comparative example, initial defect does not appear even in the $1000^{th}$ cycle in the embodiment. That is, it can be seen that by forming Au layers 212, 222 and Ni layers 210, 220 to improve the bonding strength and fatigue lifetime of solder balls 114, it is possible to reduce the chance of generation of defects.

Although not shown in the figure, the aforementioned temperature cycle test was also carried out for the assembled wiring substrate with assembly carried out for a composition of solder paste 214 of SnPb (63 wt % of Sn, and 37 wt % of Pb) and the composition (2) of SnAgCu (1.0 wt % of Ag and 0.5 wt % of Cu) as the composition of solder balls 114. It was found that initial defect occurred in the $900^{th}$ cycle. On the other hand, in the aforementioned temperature cycle test performed on the assembled wiring substrate, with assembly performed for SnPb (63 wt % of Sn and 37 wt % of Pb) taken as the composition of solder paste 214 and solder balls 114, initial defect occurred in the $500^{th}$ cycle. From this fact, independent of the composition of the solder paste, it can be seen that it is possible to reduce the chance of generation of defects by the diffusion of Au into the solder balls having a composition of SnAgCu.

In the above, the embodiment of this invention has been explained with reference to figures. However, this invention is not limited to the aforementioned embodiment. On the basis of the description of the claims, it is possible to make amendments, improvements, etc. For example, in the aforementioned embodiment, solder balls were shown as the external connecting terminals of the semiconductor device. However, it is clear to the specialist that solder lands, etc., may be used in place of solder balls.

As explained above, according to this invention, electroconductive balls containing Sn, Ag and Cu are used as electroconductive balls, and, at the same time, Au is contained in the electroconductive balls, the installing portion of the semiconductor device, and/or the connecting terminals of the wiring substrate. Consequently, Au can be contained in the electroconductive balls after the assembly operation, and it is possible to increase the bonding strength and to prolong the fatigue lifetime of the electroconductive balls, and to reduce defects due to damage to the electroconductive balls, etc.

Those skilled in the art to which the invention relates will appreciate that still other and various substitutions and modifications may be made to the described embodiments, without departing from the spirit and scope of the invention as described and as defined by the claims.

What is claimed is:

1. A type of assembly of semiconductor device and wiring substrate comprising:

a semiconductor device which has a semiconductor chip, an installing portion electrically connected to the electrode pad of said semiconductor chip, an external connecting terminals installed on said installing portion, and a wiring substrate which has an insulating substrate and a connecting terminal portion formed on said insulating substrate; the external connecting terminals of said semiconductor device are connected to the connecting terminal portion of said wiring substrate; wherein, said external connecting terminals comprising an alloy of Sn (tin), Ag (silver), Cu (copper) and Au (gold).

2. The assembly of semiconductor device and wiring substrate described in claim 1, wherein the connecting terminal portion of said wiring substrate has a layer containing Au.

3. The assembly of semiconductor device and wiring substrate described in claim 2, wherein the installing portion of said semiconductor device has a layer containing Au.

4. The assembly of semiconductor device and wiring substrate described in claim 3, wherein said layer containing Au is formed on a layer containing Ni.

5. The assembly of semiconductor device and wiring substrate described in claim 4, wherein the content of Au in said external connecting terminals is in the range of 0.1–12.0 wt %.

6. The assembly of semiconductor device and wiring substrate described in claim 5, wherein the content of Ag in said external connecting terminals is in the range of 1.0–3.5 wt %.

7. The assembly of semiconductor device and wiring substrate described in claim 6, wherein the content of Cu in said external connecting terminals is in the range of 0.5–1.0 wt %.

8. The assembly of semiconductor device and wiring substrate described in claim 7, wherein an electroconductive paste used for assembling said semiconductor device on said wiring substrate contains Sn, Ag and Cu.

* * * * *